(12) United States Patent
Lee et al.

(10) Patent No.: US 12,706,594 B2
(45) Date of Patent: Aug. 11, 2026

(54) LOW POWER FLIP-FLOP AND INTEGRATED CIRCUIT INCLUDING THE SAME

(71) Applicant: SAMSUNG ELECTRONICS CO., LTD., Suwon-si (KR)

(72) Inventors: Jaeha Lee, Suwon-si (KR); Bai-Sun Kong, Suwon-si (KR); Bomin Joo, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 22 days.

(21) Appl. No.: 18/813,909

(22) Filed: Aug. 23, 2024

(65) Prior Publication Data

US 2025/0070765 A1 Feb. 27, 2025

(30) Foreign Application Priority Data

Aug. 23, 2023 (KR) ........................ 10-2023-0110793
Dec. 18, 2023 (KR) ........................ 10-2023-0185065

(51) Int. Cl.
*H03K 3/356* (2006.01)
*H03K 3/3562* (2006.01)
*H03K 3/012* (2006.01)

(52) U.S. Cl.
CPC ......... *H03K 3/35625* (2013.01); *H03K 3/012* (2013.01)

(58) Field of Classification Search
CPC ............ H03K 3/01; H03K 3/012; H03K 3/02; H03K 3/027; H03K 3/037; H03K 3/0372;
(Continued)

(56) References Cited

U.S. PATENT DOCUMENTS 10,326,430 B2 6/2019 Lai et al.
10,374,584 B1 8/2019 Augustine et al.
(Continued)

FOREIGN PATENT DOCUMENTS

KR 10-2022-0056602 A 5/2022
KR 10-2023-0111918 A 7/2023

OTHER PUBLICATIONS

Kim et al., "A static contention-free single-phase-clocked 24T flip-flop in 45nm for low-power applications", ISSCC 2014 / SESSION 27 / Energy-Efficient Digital Circuits / 27.8, pp. 466-467 (3 pages total).

(Continued)

*Primary Examiner* — Long Nguyen
(74) *Attorney, Agent, or Firm* — Sughrue Mion, PLLC

(57) ABSTRACT

A flip-flop is provided. The flip-flop includes: a master latch; and a slave latch. The master latch includes: a first circuit configured to, based on a clock signal, a data input signal, and a first data signal, generate a second data signal complementary to the data input signal; a second circuit configured to, based on the clock signal, an inverted data input signal, and the second data signal, generate the first data signal complementary to the inverted data input signal; and a third circuit configured to generate a latch signal based on the clock signal, an input of the slave latch, and the second data signal. The slave latch is configured to latch the input of the slave latch based on the clock signal and the latch signal.

19 Claims, 17 Drawing Sheets

(58) Field of Classification Search
CPC .. H03K 3/353; H03K 3/356; H03K 3/356104; H03K 3/3562; H03K 3/35625
See application file for complete search history.

(56) References Cited

U.S. PATENT DOCUMENTS

| | | | | |
|---|---|---|---|---|
| 11,621,706 | B2 | 4/2023 | Lee et al. | |
| 2021/0203323 | A1 | 7/2021 | Hsu et al. | |
| 2022/0329234 | A1 * | 10/2022 | Kim | H03K 3/0372 |
| 2023/0045265 | A1 | 2/2023 | Oklobdzija | |

OTHER PUBLICATIONS

Shin et al., "An Ultra-Low-Power Fully-Static Contention-Free Flip-Flop With Complete Redundant Clock Transition and Transistor Elimination", IEEE Journal of Solid-State Circuits, 2021, vol. 56, Issue. 10, Doi: 10.1109/JSSC.20213077074, pp. 1-10 (11 pages total).

Cai et al., "Ultra-Low Power 18-Transistor Fully Static Contention-Free Single-Phase Clocked Flip-Flop in 65-nm CMOS", IEEE Journal of Solid-State Circuits, 2018, vol. 54, Issue. 2, Doi: 10.1109/JSSC.2018.2875089, pp. 1-10 (11 pages total).

Shin et al., "A Differential Flip-Flop With Static Contention-Free Characteristics in 28 nm for Low-Voltage, Low-Power Applications", IEEE Journal of Solid-State Circuits, vol. 58, No. 5, May 2023, DOI: 10.1109/JSSC.2022.3219091, pp. 1496-1504 (9 pages total).

Le et al., "An 82% Energy-Saving Change-Sensing Flip-Flop in 40nm CMOS for Ultra-Low Power Applications", IEEE Asian Solid-State Circuits Conference, Nov. 6-8, 2017, pp. 197-200 (4 pages total).

European Extended Search Report issued Feb. 7, 2025 by the European Patent Office for EP Patent Application No. 24195834.7.

* cited by examiner

FIG. 11

LOW POWER FLIP-FLOP AND INTEGRATED CIRCUIT INCLUDING THE SAME

CROSS-REFERENCE TO RELATED APPLICATIONS

This application is based on and claims priority under 35 U.S.C. § 119 to Korean Patent Application Nos. 10-2023-0110793 and 10-2023-0185065, respectively filed on Aug. 23, 2023 and Dec. 18, 2023, in the Korean Intellectual Property Office, the disclosures of which are incorporated by reference herein in their entireties.

BACKGROUND

The present disclosure relates to a flip-flop, and more particularly, to a low power flip-flop and an integrated circuit including the same.

An integrated circuit for processing a digital signal may include flip-flops. A flip-flop may latch an input based on a clock signal and may output the latched input. A flip-flop may include transistors, and may have various structures according to applications. According to requirements of an integrated circuit, a flip-flop designed to have low power consumption may have a reduced operating speed. An operating speed of an integrated circuit may depend on an operating speed of a flip-flop. Accordingly, there is a demand for a flip-flop having low power consumption and a limited reduction in operating speed.

SUMMARY

Example embodiments provide a low power flip-flop with a limited reduction in operating speed, and an integrated circuit including the low power flip-flop.

According to an aspect of an example embodiment, a flip-flop includes: a master latch; and a slave latch. The master latch includes: a first circuit configured to, based on a clock signal, a data input signal, and a first data signal, generate a second data signal complementary to the data input signal; a second circuit configured to, based on the clock signal, an inverted data input signal, and the second data signal, generate the first data signal complementary to the inverted data input signal; and a third circuit configured to generate a latch signal based on the clock signal, an input of the slave latch, and the second data signal. The slave latch is configured to latch the input of the slave latch based on the clock signal and the latch signal.

According to another aspect of an example embodiment, a flip-flop includes: a slave latch; and a master latch configured to generate a first data signal and a second data signal based on a clock signal, a data input signal, and an inverted data input signal, and generate a latch signal based on the clock signal, an input of the slave latch, and the second data signal, wherein the first data signal is complementary to the inverted data input signal and the second data signal is complementary to the data input signal. The slave latch is configured to latch the input of the slave latch based on the clock signal and the latch signal.

According to another aspect of an example embodiment, a method of latching a data input signal based on a clock signal, includes: based on the clock signal, the data input signal, and an inverted data input signal, generating a first data signal complementary to the inverted data input signal and a second data signal complementary to the data input signal; generating a latch signal based on the clock signal, an input of a slave latch, and the second data signal; and latching the input of the slave latch based on the clock signal and the latch signal.

BRIEF DESCRIPTION OF DRAWINGS

The above and other aspects and features will be more apparent from the following description of example embodiments, taken in conjunction with the accompanying drawings, in which:

FIG. 11 is a circuit diagram illustrating a flip-flop, according to an example embodiment;

DETAILED DESCRIPTION

Figure 1:
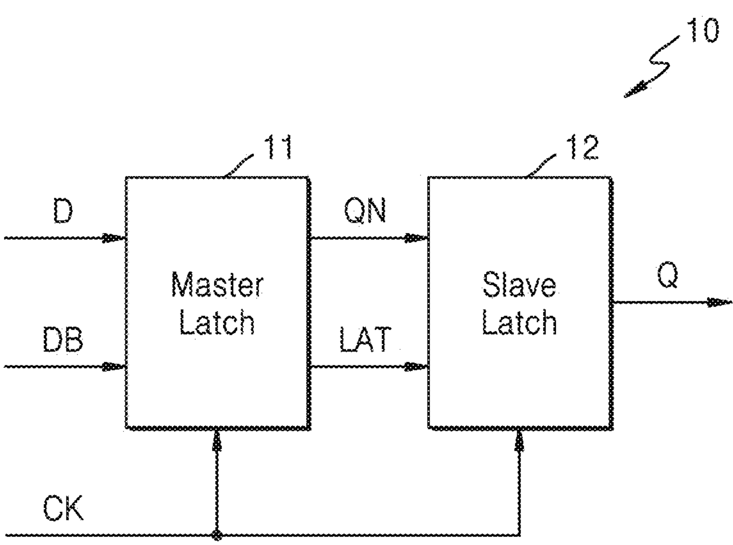
FIG. 1 is a block diagram illustrating a flip-flop, according to an example embodiment.

Hereinafter, example embodiments are described in detail with reference to the accompanying drawings. Like components are denoted by like reference numerals throughout the specification, and repeated descriptions thereof are omitted. It will be understood that when an element or layer is referred to as being “on,” “connected to” or “coupled to” another element or layer, it can be directly on, connected or coupled to the other element or layer, or intervening elements or layers may be present. By contrast, when an element is referred to as being “directly on,” “directly connected to” or “directly coupled to” another element or layer, there are no intervening elements or layers present. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure.

FIG. 1 is a block diagram illustrating a flip-flop 10, according to an example embodiment. In some example embodiments, the flip-flop 10 may be included in an integrated circuit manufactured by using a semiconductor process. As shown in FIG. 1, the flip-flop 10 may include a master latch 11 and a slave latch 12. Herein, it should be noted that signals are assumed to be active-high signals that have a logic high when activated and a logic low when deactivated unless otherwise described, but example embodiments are not limited thereto. Herein, a logic high may correspond to a positive supply voltage VDD and may be presented as '1'. Also, a logic low may correspond to a negative supply voltage VSS and may be represented as '0'.

As shown in FIG. 1, the flip-flop 10 may latch a data input D (i.e., a data input signal) based on a clock signal CK and may generate a data output Q corresponding to the latched data input D. In some example embodiments, the flip-flop 10 may be of a single-ended type, and an inverted data input DB (i.e., an inverted data input signal) may be generated based on the data input D by an inverter included in the flip-flop 10. In some example embodiments, the flip-flop 10 may be of a differential type, may receive the data input D and the inverted data input DB, and may generate the data output Q and an inverted data output. The flip-flop 10 may be a positive edge triggered flip-flop that latches the data input D in response to a rising edge of the clock signal CK, or may be a negative edge triggered flip-flop that latches the data input D in response to a falling edge of the clock signal CK. Herein, it should be noted that the flip-flop 10 is assumed to be a positive edge triggered flip-flop, but example embodiments are not limited thereto.

The master latch 11 may receive the data input D, the inverted data input DB, and the clock signal CK and may generate a slave input QN and a latch signal LAT. The slave input QN may have a logic level corresponding to the data input D and may be synchronized with a rising edge of the clock signal CK. Herein, the slave input QN may be referred to as an input of the slave latch 12, an output of the master latch 11, or a master output. The latch signal LAT and the clock signal CK may be used for the slave latch 12 to latch the slave input QN. As described below with reference to FIG. 10, the latch signal LAT may be toggled less frequently than the clock signal CK, thereby reducing power consumption of the flip-flop 10. For example, a flip-flop, such as a transmission gate flip-flop (TGFF), may use a clock and an inverted clock to control a master latch and a slave latch. The clock and the inverted clock may toggle at the same frequency. In this regard, the flip-flop may have relatively high power consumption due to the inverted clock being toggled frequently like the clock.

The master latch 11 may generate a first data signal DT and a second data signal DN in order to generate the slave input QN and the latch signal LAT. As described below with reference to FIG. 10, the first data signal DT may be complementary to the inverted data input DB, and the second data signal DN may be complementary to the data input D. As described below with reference to the drawings, the master latch 11 may generate the first data signal DT and the second data signal DN independently of the latch signal LAT, and the first data signal DT and the second data signal DN may not be floated. Accordingly, the flip-flop 10 may operate statically and in a contention-free manner, and latency caused by incomplete driving of signals may be removed. An example of the master latch 11 will be described below with reference to FIG. 2.

The slave latch 12 may receive the slave input QN, the latch signal LAT, and the clock signal CK. The slave latch 12 may latch the slave input QN based on the latch signal LAT and the clock signal CK and may generate the data output Q. An example of the slave latch 12 will be described below with reference to FIG. 7.

Figure 2:
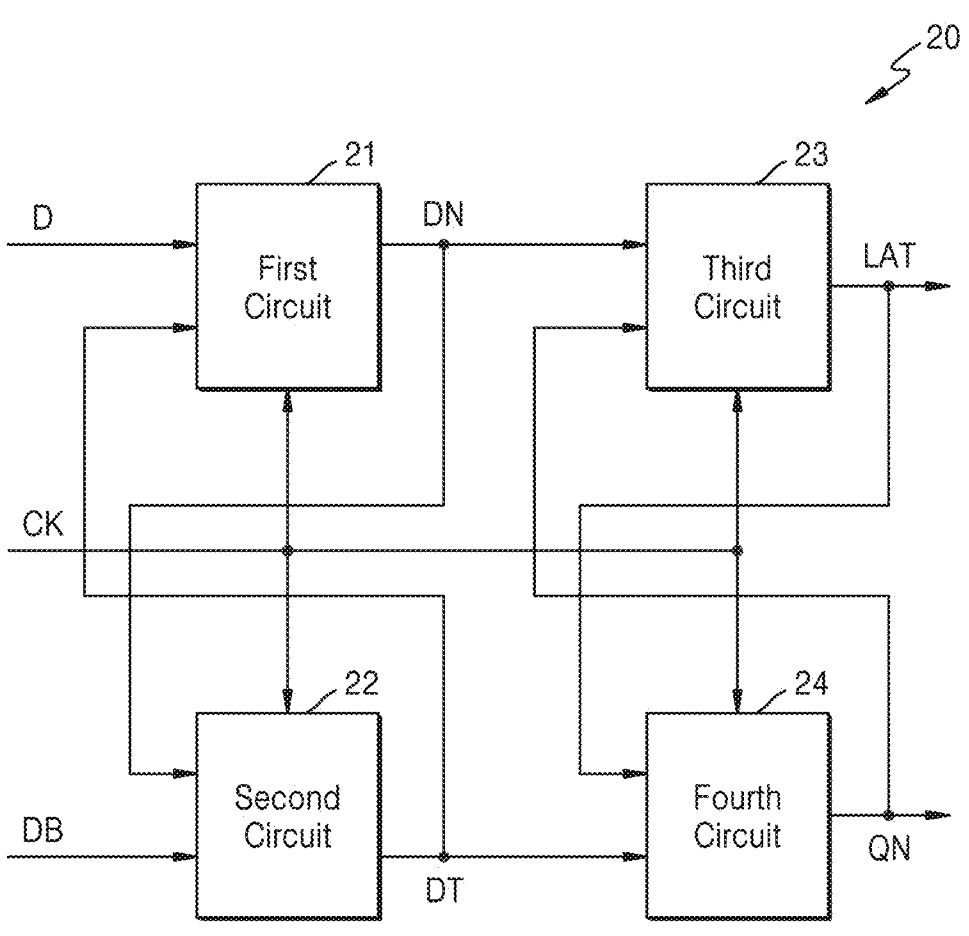
FIG. 2 is a block diagram illustrating a master latch, according to an example embodiment.

FIG. 2 is a block diagram illustrating a master latch 20, according to an example embodiment. For example, the block diagram of FIG. 2 illustrates an example of the master latch 11 of FIG. 1. As described with reference to FIG. 1, the master latch 20 may receive the data input D, the inverted data input DB, and the clock signal CK and may generate the slave input QN and the latch signal LAT. As shown in FIG. 2, the master latch 20 may include a first circuit 21, a second circuit 22, a third circuit 23, and a fourth circuit 24.

The first circuit 21 may generate the second data signal DN based on the clock signal CK, the data input D, and the first data signal DT. For example, as shown in FIG. 2, the first circuit 21 may receive the clock signal CK and the data input D from the outside of the master latch 20 and may receive the first data signal DT from the second circuit 22. As described below with reference to FIG. 3, the first circuit 21 may statically generate the second data signal DN based on the clock signal CK, the data input D, and the first data signal DT. For example, the second data signal DN may be generated independently of the latch signal LAT and may not be floated. In this regard, the second data signal DN may be completely driven. The first circuit 21 may include at least one transistor, and an example of the first circuit 21 will be described below with reference to FIG. 3.

The second circuit 22 may generate the first data signal DT based on the clock signal CK, the inverted data input DB, and the second data signal DN. For example, as shown in FIG. 2, the second circuit 22 may receive the clock signal CK and the inverted data input DB from the outside of the master latch 20 and may receive the second data signal DN from the first circuit 21. As described below with reference to FIG. 4, the second circuit 22 may statically generate the first data signal DT based on the clock signal CK, the inverted data input DB, and the second data signal DN. For example, the first data signal DT may be generated independently of the latch signal LAT and may not be floated. In this regard, the first data signal DT may be completely driven. The second circuit 22 may include at least one transistor, and an example of the second circuit 22 will be described below with reference to FIG. 4.

The third circuit 23 may generate the latch signal LAT based on the clock signal CK, the second data signal DN, and the slave input QN. For example, as shown in FIG. 2, the third circuit 23 may receive the clock signal CK from the outside of the master latch 20, may receive the second data signal DN from the first circuit 21, and may receive the slave input QN from the fourth circuit 24. As described below with reference to FIG. 5, the latch signal LAT may have a pull-up path and a pull-down path which are simple, and thus, latency caused by the latch signal LAT may be removed. The third circuit 23 may include at least one transistor, and an example of the third circuit will be described below with reference to FIG. 5.

The fourth circuit 24 may update the slave input QN based on the first data signal DT, the clock signal CK and the latch signal LAT. For example, as shown in FIG. 2, the fourth circuit 24 may receive the clock signal CK from the outside of the master latch 20, may receive the latch signal LAT from the third circuit 23, and may receive the first data signal DT from the second circuit 22. As described below with reference to FIGS. 6A and 6B, the fourth circuit 24 may update the slave input QN by inverting the first data signal DT based on the clock signal CK and the latch signal LAT.

The fourth circuit 24 may include at least one transistor, and examples of the fourth circuit 24 will be described below with reference to FIGS. 6A and 6B.

In some example embodiments, at least two of the first circuit 21, the second circuit 22, the third circuit 23, and the fourth circuit 24 may share at least one transistor. In some example embodiments, at least one of the first circuit 21, the second circuit 22, the third circuit 23, and the fourth circuit 24 may share at least one transistor with the slave latch 12 of FIG. 1. Accordingly, the flip-flop 10 of FIG. 1 may include a reduced number of transistors. An example where at least one transistor is shared by at least two circuits will be described with reference to FIG. 11.

Figure 3:
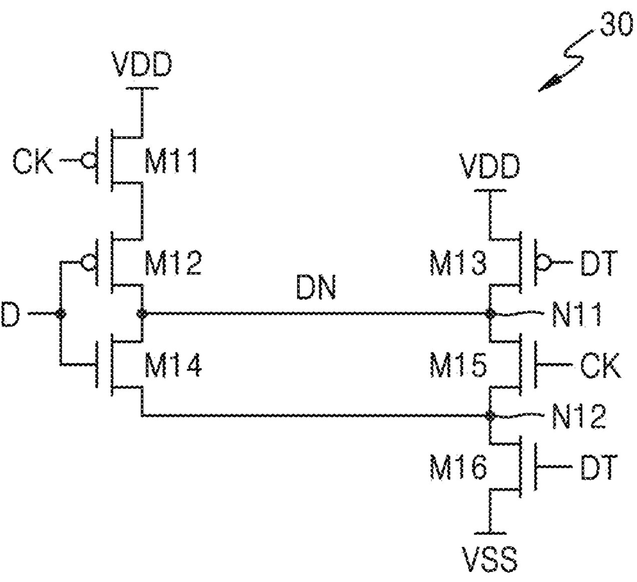
FIG. 3 is a circuit diagram illustrating a first circuit, according to an example embodiment.

FIG. 3 is a circuit diagram illustrating a first circuit 30, according to an example embodiment. For example, the circuit diagram of FIG. 3 illustrates an example of the first circuit 21 of FIG. 2. As described with reference to FIG. 2, the first circuit 30 may generate the second data signal DN based on the clock signal CK, the data input D, and the first data signal DT.

As shown in FIG. 3, the first circuit 30 may include first to sixth transistors M11 to M16. The first to third transistors M11 to M13 may be p-channel field effect transistors (PFETs), and the fourth to sixth transistors M14 to M16 may be n-channel field effect transistors (NFETs). Each of the first to sixth transistors M11 to M16 may include a gate that receives one of the clock signal CK, the data input D, and the first data signal DT.

The first transistor M11 and the second transistor M12 may respectively receive the clock signal CK and the data input D, and may be connected in series to each other between a node (referred to as a first power node) to which a positive supply voltage VDD is applied and a first node N11 where the second data signal DN is generated. In some example embodiments, the first transistor M11 and the second transistor M12 may be connected in series to each other in an order different from that illustrated in FIG. 3. The third transistor M13 may receive the first data signal DT and may be connected between the first power node and the first node N11. The fourth transistor M14 and the fifth transistor M15 may respectively receive the data input D and the clock signal CK and may be connected in parallel to each other between the first node N11 and a second node N12. The sixth transistor M16 may receive the first data signal DT and may be connected between the second node N12 and a node (referred to as a second power node) to which a negative supply voltage is applied. In some example embodiments, as described below with reference to FIG. 11, the first transistor M11 may be shared with the second circuit 22 of FIG. 2.

Figure 4:
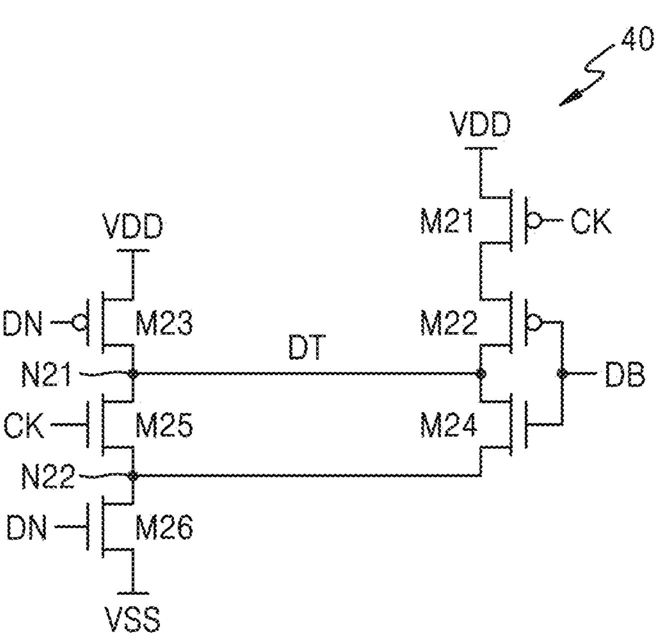
FIG. 4 is a circuit diagram illustrating a second circuit, according to an example embodiment.

FIG. 4 is a circuit diagram illustrating a second circuit 40, according to an example embodiment. For example, the circuit diagram of FIG. 4 illustrates an example of the second circuit 22 of FIG. 2. As described with reference to FIG. 2, the second circuit 40 may generate the first data signal DT based on the clock signal CK, the inverted data input DB, and the second data signal DN.

As shown in FIG. 4, the second circuit 40 may include first to sixth transistors M21 to M26. The first to third transistors M21 to M23 may be PFETs, and the fourth to sixth transistors M24 to M26 may be NFETs. Each of the first to sixth transistors M21 to M26 may include a gate that receives one of the clock signal CK, the inverted data input DB, and the second data signal DN.

The first transistor M21 and the second transistor M22 may respectively receive the clock signal CK and the inverted data input DB and may be connected in series to each other between a first power node to which a positive supply voltage VDD is applied and a first node N21 where the first data signal DT is generated. In some example embodiments, the first transistor M21 and the second transistor M22 may be connected in series to each other in an order different from that illustrated in FIG. 4. The third transistor M23 may receive the second data signal DN and may be connected between the first power node and the first node N21. The fourth transistor M24 and the fifth transistor M25 may respectively receive the inverted data input DB and the clock signal CK and may be connected in parallel to each other between the first node N21 and a second node N22. The sixth transistor M26 may receive the second data signal DN and may be connected between the second node N22 and a second power node to which a negative supply voltage VSS is applied. In some example embodiments, as described below with reference to FIG. 11, the first transistor M21 may be shared with the first circuit 21 of FIG. 2. In some example embodiments, as described below with reference to FIG. 11, the sixth transistor M26 may be shared with the third circuit 23 of FIG. 2.

Figure 5:
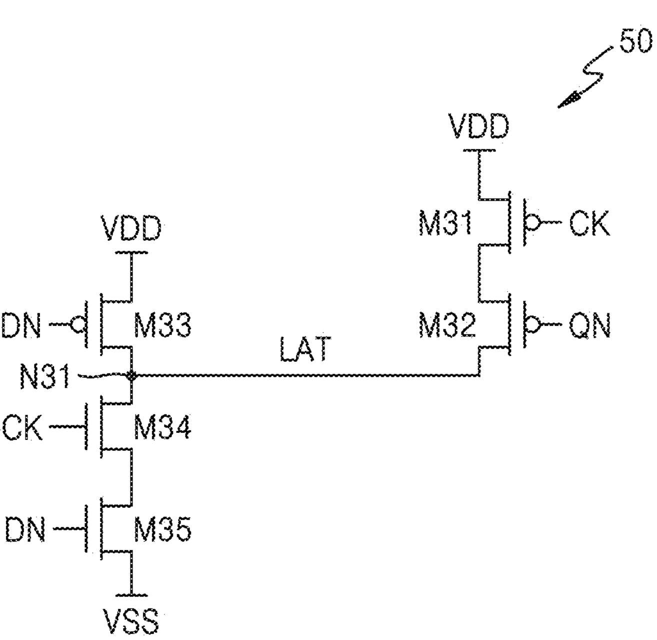
FIG. 5 is a circuit diagram illustrating a third circuit, according to an example embodiment.

FIG. 5 is a circuit diagram illustrating a third circuit 50, according to an example embodiment. For example, the circuit diagram of FIG. 5 illustrates an example of the third circuit 23 of FIG. 2. As described with reference to FIG. 2, the third circuit 50 may generate the latch signal LAT based on the clock signal CK, the slave input QN, and the second data signal DN.

As shown in FIG. 5, the third circuit 50 may include first to fifth transistors M31 to M35. The first to third transistors M31 to M33 may be PFETs, and the fourth transistor M34 and the fifth transistor M35 may be NFETs. Each of the first to fifth transistors M31 to M35 may include a gate that receives one of the clock signal CK, the slave input QN, and the second data signal DN.

The first transistor M31 and the second transistor M32 may respectively receive the clock signal CK and the slave input QN and may be connected in series to each other between a first power node to which a positive supply voltage VDD is applied and a first node N31 where the latch signal LAT is generated. In some example embodiments, the first transistor M31 and the second transistor M32 may be connected in series to each other in an order different from that illustrated in FIG. 5. The third transistor M33 may receive the second data signal DN and may be connected between the first power node and the first node N31. The fourth transistor M34 and the fifth transistor M35 may respectively receive the clock signal CK and the second data signal DN and may be connected in series to each other between the first node N31 and a second power node to which a negative supply voltage VSS is applied. In some example embodiments, the fourth transistor M34 and the fifth transistor M35 may be connected in series to each other in an order different from that illustrated in FIG. 5. In some example embodiments, as described below with reference to FIG. 11, the first transistor M31 may be shared with the slave latch 12 of FIG. 1. In some example embodiments, as described below with reference to FIG. 11, the fifth transistor M35 may be shared with the second circuit 22 of FIG. 2.

Figure 6A:
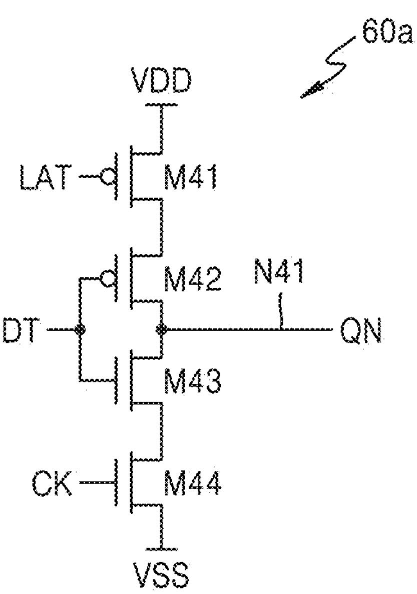
FIGS. 6A and 6B are circuit diagrams illustrating examples of a fourth circuit, according to example embodiments.
Figure 6B:
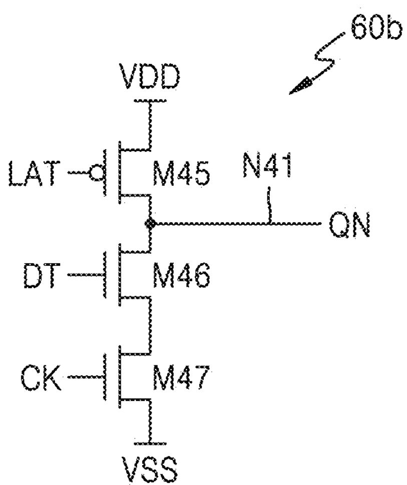

FIGS. 6A and 6B are circuit diagrams illustrating examples of a fourth circuit, according to example embodiments. For example, the circuit diagrams of FIGS. 6A and 6B illustrate examples of the fourth circuit 24 of FIG. 2. As described with reference to FIG. 2, fourth circuits 60*a* and 60*b* may update the slave input QN based on the first data signal DT, the clock signal CK and the latch signal LAT.

Referring to FIG. 6A, the fourth circuit 60*a* may include first to fourth transistors M41 to M44. The first transistor M41 and the second transistor M42 may be PFETs, and the third transistor M43 and the fourth transistor M44 may be NFETs. Each of the first to fourth transistors M41 to M44 may include a gate that receives one of the clock signal CK, the latch signal LAT, and the first data signal DT.

The first transistor M41 and the second transistor M42 may respectively receive the latch signal LAT and the first data signal DT and may be connected in series to each other between a first power node to which a positive supply voltage VDD is applied and a first node N41 where the slave input QN is generated. In some example embodiments, the first transistor M41 and the second transistor M42 may be connected in series to each other in an order different from that illustrated in FIG. 6A. The third transistor M43 and the fourth transistor M44 may respectively receive the first data signal DT and the clock signal CK and may be connected in series to each other between the first node N41 and a second power node to which a negative supply voltage VSS is applied. In some example embodiments, the third transistor M43 and the fourth transistor M44 may be connected in series to each other in an order different from that illustrated in FIG. 6A.

Referring to FIG. 6B, the fourth circuit 60*b* may include fifth to seventh transistors M45 to M47. Compared to the fourth circuit 60*a* of FIG. 6A, the fourth circuit 60*b* may not include a transistor corresponding to the second transistor M42 of FIG. 6A. The fifth transistor M45 may be a PFET, and the sixth transistor M46 and the seventh transistor M47 may be NFETs. Each of the fifth to seventh transistors M45 to M47 may include a gate that receives one of the clock signal CK, the latch signal LAT, and the first data signal DT.

The fifth transistor M45 may receive the latch signal LAT and may be connected between a first power node to which the positive supply voltage VDD is applied and the first node N41 where the slave input QN is generated. The sixth transistor M46 and the seventh transistor M47 may respectively receive the first data signal DT and the clock signal CK and may be connected in series to each other between the first node N41 and a second power node to which the negative supply voltage VSS is applied. In some example embodiments, the sixth transistor M46 and the seventh transistor M47 may be connected in series to each other in an order different from that illustrated in FIG. 6B.

Figure 7:
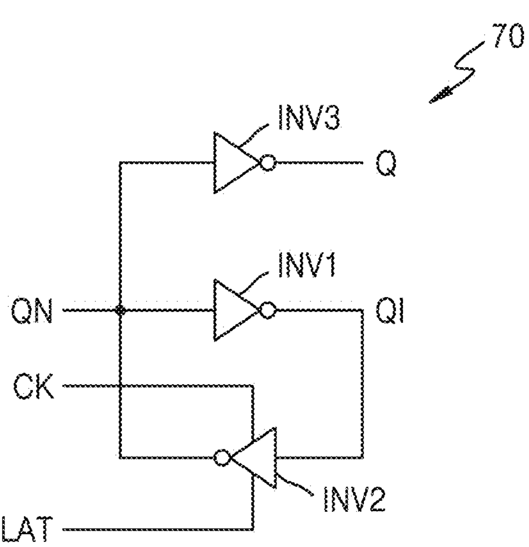
FIG. 7 is a block diagram illustrating a slave latch, according to an example embodiment.

FIG. 7 is a block diagram illustrating a slave latch 70, according to an example embodiment. For example, the block diagram of FIG. 7 illustrates an example of the slave latch 12 of FIG. 1. As described with reference to FIG. 1, the slave latch 70 may receive the slave input QN, the latch signal LAT, and the clock signal CK and may generate the data output Q. As shown in FIG. 7, the slave latch 70 may include first to third inverters INV1 to INV3.

The first inverter INV1 may receive the slave input QN and may generate an internal data output QI. The first inverter INV1 may generate the internal data output QI by inverting the slave input QN. The third inverter INV3 may receive the slave input QN and may generate the data output Q. The third inverter INV3 may generate the data output Q by inverting the slave input QN. In some example embodiments, each of the first inverter INV1 and the third inverter INV3 may include a PFET and an NFET connected in series to each other between a first power node to which a positive supply voltage VDD is applied and a second power node to which a negative supply voltage VSS is applied.

The second inverter INV2 may be cross-coupled to the first inverter INV1. That is, the second inverter INV2 may receive the internal data output QI, which is an output of the first inverter INV1, and may generate the slave input QN, which is an input of the first inverter INV1. Also, as shown in FIG. 7, the second inverter INV2 may receive the clock signal CK and the latch signal LAT. The second inverter INV2 may update the slave input QN based on the internal data output QI, the clock signal CK and the latch signal LAT. For example, when the clock signal CK is 0 and the internal data output QI is 0, the second inverter INV2 may update the slave input QN to 1. Also, when the latch signal LAT is 1 and the internal data output QI is 1, the second inverter INV2 may update the slave input QN to 0. The second inverter INV2 may include at least one transistor, and an example of the second inverter INV2 will be described below with reference to FIG. 8.

Figure 8:
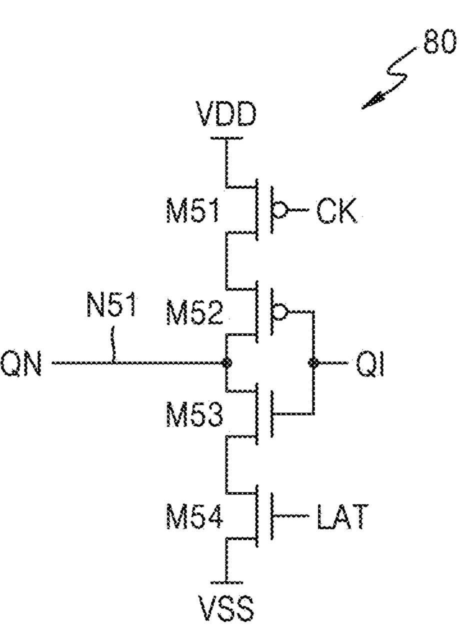
FIG. 8 is a circuit diagram illustrating a second inverter, according to an example embodiment.

FIG. 8 is a circuit diagram illustrating a second inverter 80, according to an example embodiment. For example, the circuit diagram of FIG. 8 illustrates an example of the second inverter INV2 of FIG. 7. As described with reference to FIG. 7, the second inverter 80 may update the slave input QN based on the internal data output QI, the clock signal CK and the latch signal LAT.

As shown in FIG. 8, the second inverter 80 may include first to fourth transistors M51 to M54. The first transistor M51 and the second transistor M52 may be PFETs, and the third transistor M53 and the fourth transistor M54 may be NFETs. Each of the first to fourth transistors M51 to M54 may include a gate that receives one of the clock signal CK, the latch signal LAT, and the internal data output QI.

The first transistor M51 and the second transistor M52 may respectively receive the clock signal CK and the internal data output QI and may be connected in series to each other between a first power node to which a positive supply voltage VDD is applied and a first node N51 where the slave input QN is updated. In some example embodiments, the first transistor M51 and the second transistor M52 may be connected in series to each other in an order different from that illustrated in FIG. 8. The third transistor M53 and the fourth transistor M54 may respectively receive the internal data output QI and the latch signal LAT and may be connected in series to each other between the first node N51 and a second power node to which a negative supply voltage VSS is applied. In some example embodiments, the third transistor M53 and the fourth transistor M54 may be connected in series to each other in an order different from that illustrated in FIG. 8. In some example embodiments, as described below with reference to FIG. 11, the first transistor M51 may be shared with the third circuit 23 of FIG. 2.

Figure 9:
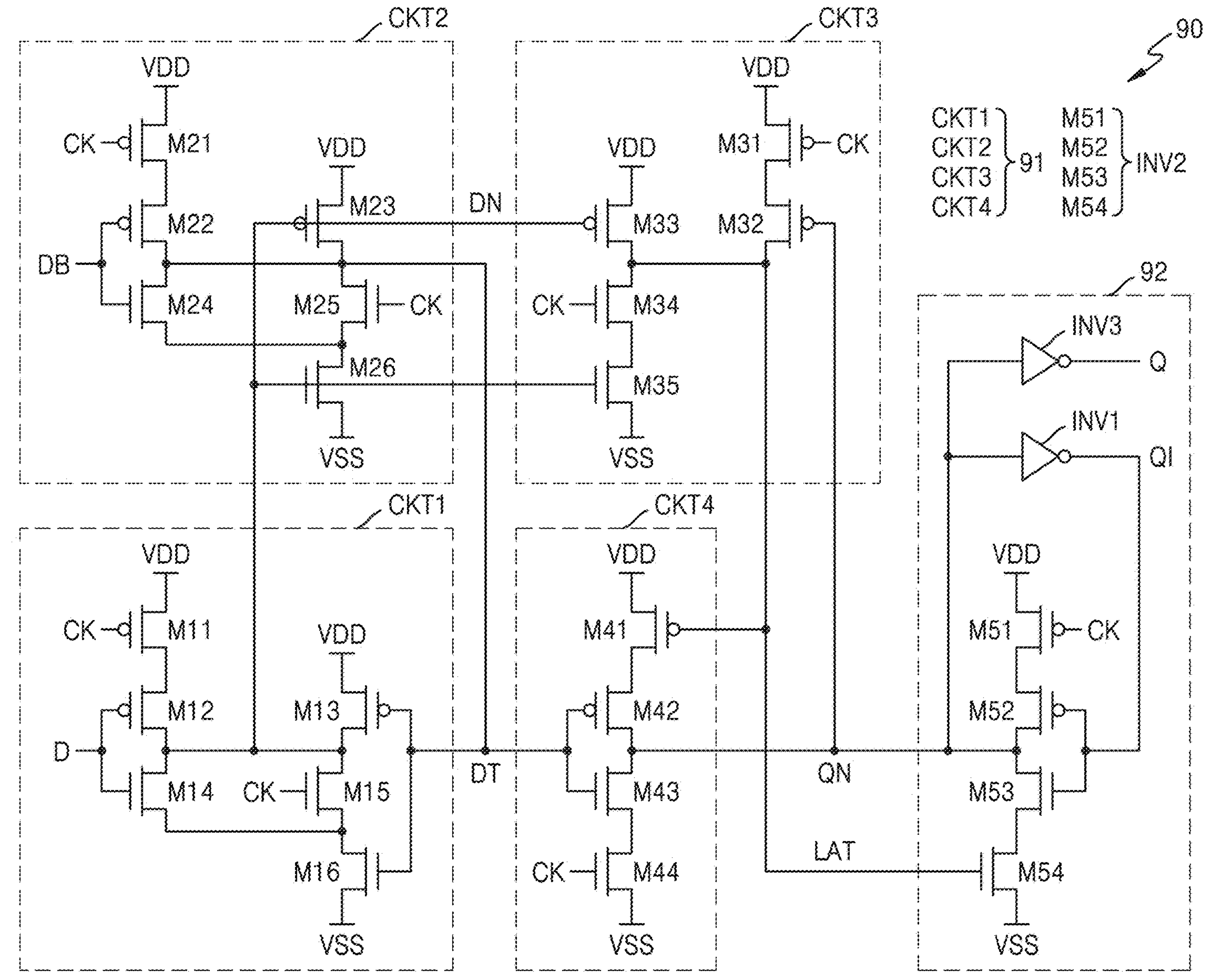
FIG. 9 is a circuit diagram illustrating a flip-flop, according to an example embodiment.

FIG. 9 is a circuit diagram illustrating a flip-flop 90, according to an example embodiment. As described above with reference to the drawings, the flip-flop 90 may include a master latch 91 and a slave latch 92. In FIG. 9, the same description as that made above with reference to the drawings will be omitted.

Referring to FIG. 9, the master latch 91 may include first to fourth circuits CKT1 to CKT4. The first circuit CKT1 may correspond to the first circuit 30 of FIG. 3. For example, as shown in FIG. 9, the first circuit CKT1 may include the first to sixth transistors M11 to M16. The second circuit CKT2 may correspond to the second circuit 40 of FIG. 4. For example, as shown in FIG. 9, the second circuit CKT2 may include the first to sixth transistors M21 to M26. The third circuit CKT3 may correspond to the third circuit 50 of FIG. 5. For example, as shown in FIG. 9, the third circuit CKT3 may include the first to fifth transistors M31 to M35. The fourth circuit CKT4 may correspond to the fourth circuit 60*a* of FIG. 6A. For example, as shown in FIG. 9, the fourth circuit CKT4 may include the first to fourth transistors M41 to M44.

The slave latch 92 may correspond to the slave latch 70 of FIG. 7, and the second inverter INV2 of the slave latch 70 may correspond to the second inverter 80 of FIG. 8. For example, as shown in FIG. 9, the slave latch 92 may include the first inverter INV1, the third inverter INV3, and the first to fourth transistors M51 to M54.

In some example embodiments, the first transistor M11 and the second transistor M12 of the first circuit CKT1 may be connected in series to each other in an order different from that illustrated in FIG. 9. In some example embodiments, the first transistor M21 and the second transistor M22 of the second circuit CKT2 may be connected in series to each other in an order different from that illustrated in FIG. 9. In some example embodiments, the first transistor M31 and the second transistor M32 of the third circuit CKT3 may be connected in series to each other in an order different from that illustrated in FIG. 9. In some example embodiments, the fourth transistor M34 and the fifth transistor M35 of the third circuit CKT3 may be connected in series to each other in an order different from that illustrated in FIG. 9. In some example embodiments, the first transistor M41 and the second transistor M42 of the fourth circuit CKT4 may be connected in series to each other in an order different from that illustrated in FIG. 9. In some example embodiments, the third transistor M43 and the fourth transistor M44 of the fourth circuit CKT4 may be connected in series to each other in an order different from that illustrated in FIG. 9. In some example embodiments, the first transistor M51 and the second transistor M52 of the slave latch 92 may be connected in series to each other in an order different from that illustrated in FIG. 9. In some example embodiments, the third transistor M53 and the fourth transistor M54 of the slave latch 92 may be connected in series to each other in an order different from that illustrated in FIG. 9.

Figure 10:
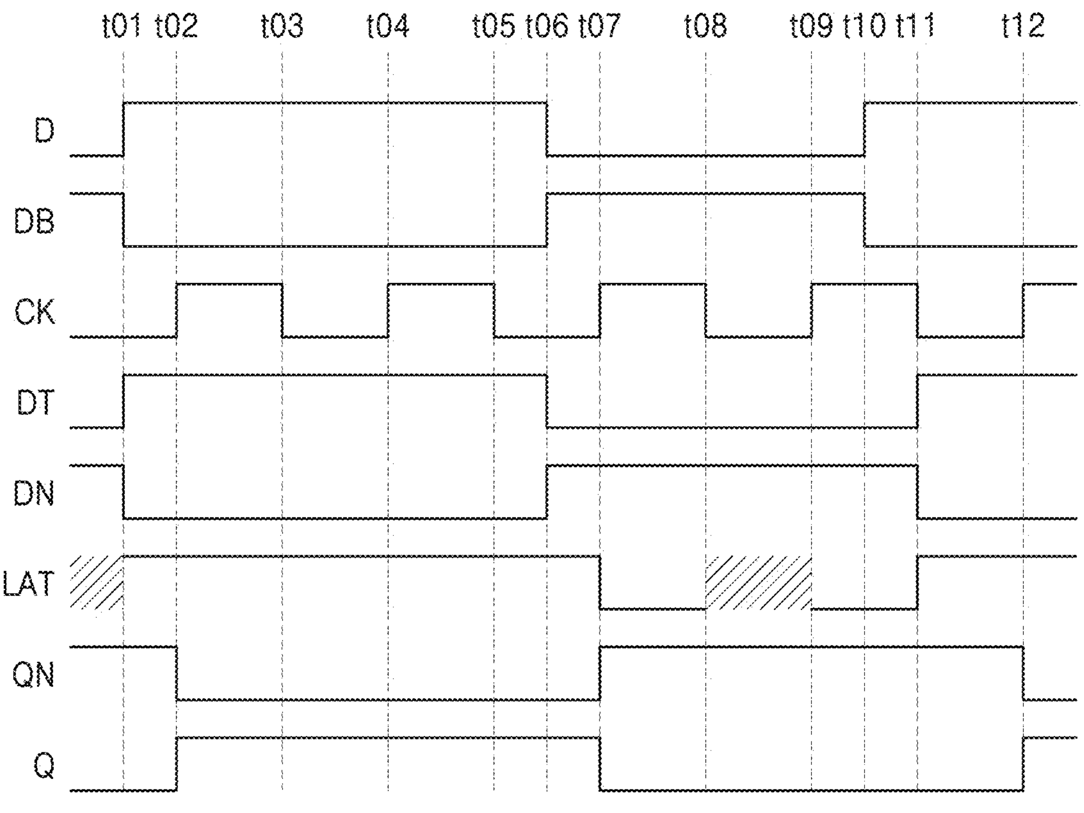
FIG. 10 is a timing diagram illustrating an operation of a flip-flop, according to an example embodiment.

FIG. 10 is a timing diagram illustrating an operation of a flip-flop, according to an example embodiment. For example, the timing diagram of FIG. 10 illustrates an example of an operation of the flip-flop 90 of FIG. 9. Hereinafter, FIG. 10 will be described with reference to FIG. 9.

Referring to FIG. 10, before a time t01, each of the clock signal CK, the data input D, and the data output Q may be 0. The first circuit CKT1 may generate the second data signal DN of 1 due to the clock signal CK of 0 and the data input D of 0. The second circuit CKT2 may generate the first data signal DT of 0 due to the inverted data input DB of 1 and the second data signal DN of 1. The third circuit CKT3 may generate the latch signal LAT, which is floated, due to the clock signal CK of 0, the second data signal DN of 1, and the slave input QN of 1. The fourth circuit CKT4 may not drive the slave input QN due to the clock signal CK of 0 and the floated latch signal LAT, but the second inverter INV2 may generate the slave input QN of 1 due to the internal data output QI and the clock signal CK of 0. The third inverter INV3 may generate the data output Q of 0 due to the slave input QN of 1.

At a time t01, the data input D may transition to 1, and the inverted data input DB may transition to 0. The second circuit CKT2 may generate the first data signal DT of 1 due to the clock signal CK of 0 and the inverted data input DB of 0. The first circuit CKT1 may generate the second data signal DN of 0 due to the data input D of 1 and the first data signal DT of 1. The third circuit CKT3 may generate the latch signal LAT of 1 due to the second data signal DN of 0. The second inverter INV2 may hold the slave input QN of 1, and the third inverter INV3 may hold the data output Q of 0.

At a time t02, a rising edge of the clock signal CK may occur. The first circuit CKT1 may hold the second data signal DN of 0 due to the clock signal CK of 1 and the first data signal DT of 1. The second circuit CKT2 may hold the first data signal DT of 1 due to the second data signal DN of 0. The third circuit CKT3 may hold the latch signal LAT of 1 due to the second data signal DN of 0. The fourth circuit CKT4 may generate the slave input QN of 0 due to the first data signal DT of 1 and the clock signal CK of 1. The first inverter INV1 may generate the internal data output QI of 1 due to the slave input QN of 0. The second inverter INV2 may hold the slave input QN of 0 due to the slave input QN of 0 and the latch signal LAT of 1. The third inverter INV3 may generate the data output Q of 1 due to the slave input QN of 0.

At a time t03, a falling edge of the clock signal CK may occur. The second circuit CKT2 may hold the first data signal DT of 1 due to the clock signal CK of 0 and the inverted data input DB of 0. The first circuit CKT1 may hold the second data signal DN of 0 due to the data input D of 1 and the first data signal DT of 1. The third circuit CKT3 may hold the latch signal LAT of 1 due to the second data signal DN of 0. The second inverter INV2 may hold the slave input QN of 0. The third inverter INV3 may hold the data output Q of 1.

At a time t04, a rising edge of the clock signal CK may occur. The first circuit CKT1 may hold the second data signal DN of 0 due to the clock signal CK of 1 and the first data signal DT of 1. The second circuit CKT2 may hold the first data signal DT of 1 due to the second data signal DN of 0. The third circuit CKT3 may hold the latch signal LAT of 1 due to the second data signal DN of 0. The fourth circuit CKT4 may generate the slave input QN of 0 due to the first data signal DT of 1 and the clock signal CK of 1. The first inverter INV1 may generate the internal data output QI of 1 due to the slave input QN of 0. The second inverter INV2 may hold the slave input QN of 0 due to the slave input QN of 0 and the latch signal LAT of 1. The third inverter INV3 may generate the data output Q of 1 due to the slave input QN of 0.

At a time t05, a falling edge of the clock signal CK may occur. The second circuit CKT2 may hold the first data signal DT of 1 due to the clock signal CK of 0 and the inverted data input DB of 0. The first circuit CKT1 may hold the second data signal DN of 0 due to the data input D of 1 and the first data signal DT of 1. The third circuit CKT3 may hold the latch signal LAT of 1 due to the second data signal DN of 0. The second inverter INV2 may hold the slave input QN of 0, and the third inverter INV3 may hold the data output Q of 1.

At a time t06, the data input D may transition to 0, and the inverted data input DB may transition to 1. The first circuit CKT1 may generate the second data signal DN of 1 due to the clock signal CK of 0 and the data input D of 0. The second circuit CKT2 may generate the first data signal DT of 0 due to the inverted data input DB of 1 and the second data signal DN of 1. The third circuit CKT3 may hold the latch signal LAT of 1 due to the clock signal CK of 0 and the slave input QN of 0. The fourth circuit CKT4 may not drive the slave input QN due to the clock signal CK of 0 and the latch signal LAT of 1, but the second inverter INV2 may hold the slave input QN of 0 due to the clock signal CK of 0, the latch signal LAT of 1, and the internal data output QI of 1. The third inverter INV3 may generate the data output Q of 1 due to the slave input QN of 0.

At a time t07, a rising edge of the clock signal CK may occur. The second circuit CKT2 may hold the first data signal DT of 0 due to the clock signal CK of 1 and the inverted data input DB of 1. The first circuit CKT1 may hold the second data signal DN of 1 due to the first data signal DT of 0. The third circuit CKT3 may generate the latch signal LAT of 0 due to the first data signal DT and the clock signal CK of 1. The fourth circuit CKT4 may generate the slave input QN of 1 based on the first data signal DT of 0, the clock signal CK of 1 and the latch signal LAT of 0. The first inverter INV1 may generate the internal data output QI of 0 based on the slave input QN of 1. The third inverter INV3 may generate the data output Q of 0 based on the slave input QN of 1.

At a time t08, a falling edge of the clock signal CK may occur. The first circuit CKT1 may hold the second data signal DN of 1 due to the clock signal CK of 0 and the data input D of 0. The second circuit CKT2 may hold the first data signal DT of 0 due to the inverted data input DB of 1 and the second data signal DN of 1. The third circuit CKT3 may generate the latch signal LAT, which is floated, due to the clock signal CK of 0, the second data signal DN of 1, and the slave input QN of 1. The fourth circuit CKT4 may not drive the slave input QN due to the clock signal CK of 0 and the floated latch signal LAT, but the second inverter INV2 may generate the slave input QN of 1 due to the internal data output QI of 0 and the clock signal CK of 0. The third inverter INV3 may generate the data output Q of 0 due to the slave input QN of 1.

At a time t09, a rising edge of the clock signal CK may occur. The second circuit CKT2 may hold the first data signal DT of 0 due to the clock signal CK of 1 and the second data signal DN of 1. The first circuit CKT1 may hold the second data signal DN of 1 due to the first data signal DT of 0. The third circuit CKT3 may generate the latch signal LAT of 0 due to the clock signal CK of 1 and the second data signal DN of 1. The fourth circuit CKT4 may generate the slave input QN of 1 due to the first data signal DT of 0 and the latch signal LAT of 0. The first inverter INV1 may generate the internal data output QI of 0 due to the slave input QN of 1. The third inverter INV3 may hold the data output Q of 0 due to the slave input QN of 1.

At a time t10, the data input D may transition to 1, and the inverted data input DB may transition to 0. The first circuit CKT1 may hold the second data signal DN of 1 due to the first data signal DT of 0. The second circuit CKT2 may hold the first data signal DT of 0 due to the clock signal CK of 1 and the second data signal DN of 1. The third circuit CKT3 may hold the latch signal LAT of 0 due to the clock signal CK of 1 and the second data signal DN of 1. The fourth circuit CKT4 may hold the slave input QN of 1 due to the first data signal DT of 0 and the latch signal LAT of 0. The first inverter INV1 may generate the internal data output QI of 0 due to the slave input QN of 1. The third inverter INV3 may hold the data output Q of 0 due to the slave input QN of 1.

At a time t11, a falling edge of the clock signal CK may occur. The second circuit CKT2 may generate the first data signal DT of 1 due to the clock signal CK of 0 and the inverted data input DB of 0. The first circuit CKT1 may generate the second data signal DN of 0 due to the data input D of 1 and the first data signal DT of 1. The third circuit CKT3 may generate the latch signal LAT of 1 due to the second data signal DN of 0. The second inverter INV2 may hold the slave input QN of 1 due to the internal data output QI of 0 and the clock signal CK of 0. The third inverter INV3 may hold the data output Q of 0 due to the slave input QN of 1.

At a time t12, a rising edge of the clock signal CK may occur. The first circuit CKT1 may hold the second data signal DN of 0 due to the clock signal CK of 1 and the first data signal DT of 1. The second circuit CKT2 may hold the first data signal DT of 1 due to the second data signal DN of 0. The third circuit CKT3 may hold the latch signal LAT of 1 due to the second data signal DN of 0. The fourth circuit CKT4 may generate the slave input QN of 0 due to the first data signal DT of 1 and the clock signal CK of 1. The first inverter INV1 may generate the internal data output QI of 1 due to the slave input QN of 0. The second inverter INV2 may hold the slave input QN of 0 due to the internal data output QI of 1 and the latch signal LAT of 1. The third inverter INV3 may generate the data output Q of 1 due to the slave input QN of 0.

Figure 11:
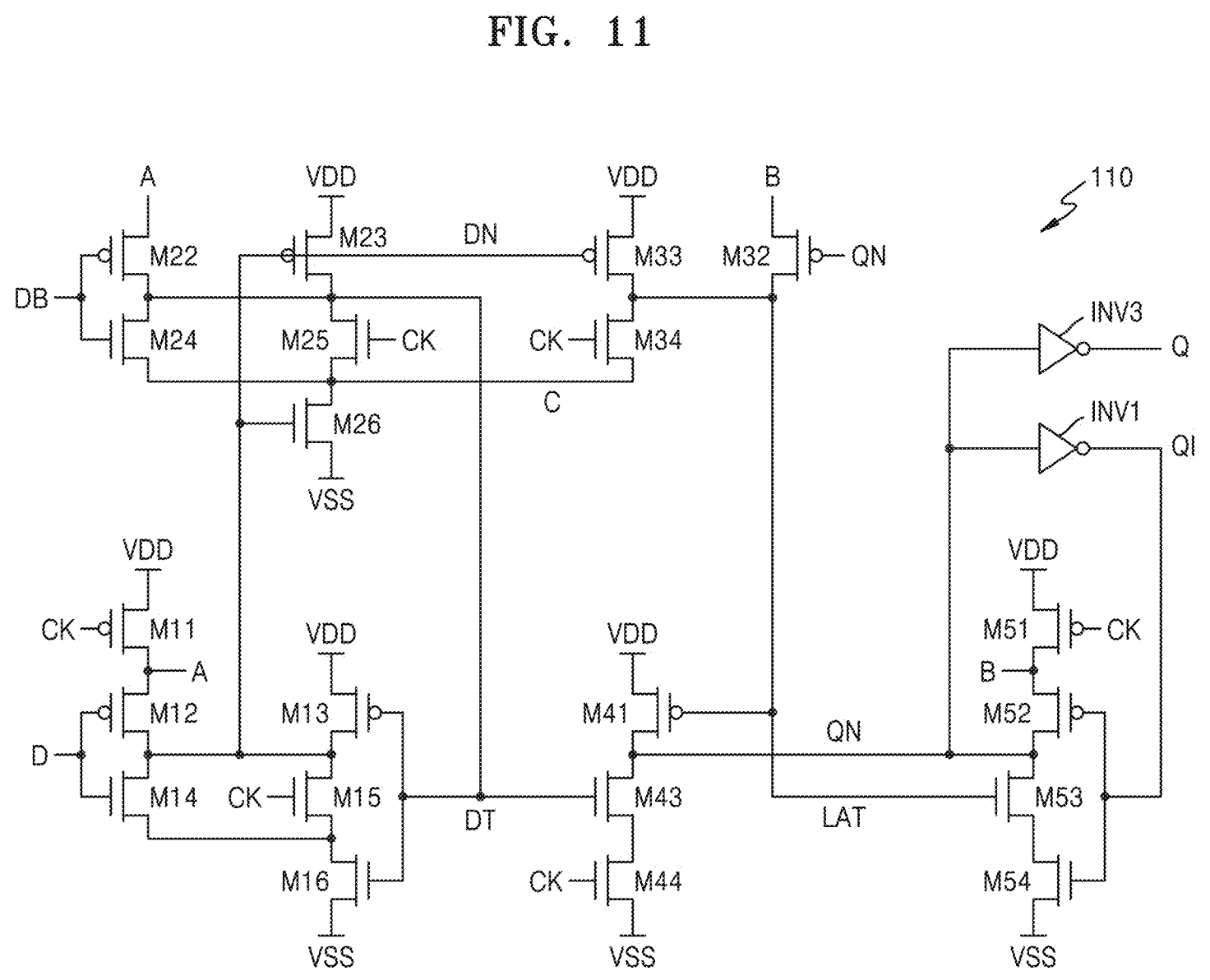

FIG. 11 is a circuit diagram illustrating a flip-flop 110, according to an example embodiment. For example, the circuit of FIG. 11 illustrates the flip-flop 110 having a structure in which at least one transistor is shared by circuits in the flip-flop 90 of FIG. 9. Hereinafter, FIG. 11 will be described with reference to FIG. 9, and the same description as that made above with reference to the drawings will be omitted. It should be noted that only some of transistors described as shared below may be shared by two or more circuits.

Referring to FIG. 11, the flip-flop 110 may include a plurality of transistors. For example, the flip-flop 110 may include a mater latch, and the master latch may include the first to sixth transistors M11 to M16 corresponding to the first circuit CKT1, the second to sixth transistors M22 to M26 corresponding to the second circuit CKT2, the second to fourth transistors M32 to M34 corresponding to the third circuit CKT3, and the first transistor M41, the third transistor M43, and the fourth transistor M44 corresponding to the fourth circuit CKT4. In some example embodiments, the third transistor M43 and the fourth transistor M44 may be connected in series to each other in an order different from that illustrated in FIG. 11. Also, the flip-flop 110 may include a slave latch, and the slave latch may include the first inverter INV1, the first to fourth transistors M51 to M54 corresponding to the second inverter INV2, and the third inverter INV3. In some example embodiments, the third transistor M53 and the fourth transistor M54 may be connected in series to each other in an order different from that illustrated in FIG. 11.

In some example embodiments, the first circuit CKT1 and the second circuit CKT2 may share at least one transistor. For example, the first transistor M11 may be shared by the first circuit CKT1 and the second circuit CKT2. As shown in FIG. 11, a node A to which the first transistor M11 and the second transistor M12 are connected may be connected to the second transistor M22. That is, in FIG. 9, the first transistor M11 of the first circuit CKT1 and the first transistor M21 of the second circuit CKT2 may be replaced with one transistor (i.e., M11 of FIG. 11).

In some example embodiments, the second circuit CKT2 and the third circuit CKT3 may share at least one transistor. For example, the sixth transistor M26 may be shared by the second circuit CKT2 and the third circuit CKT3. As shown in FIG. 11, a node C to which the sixth transistor M26 and the fifth transistor M25 (or the fourth transistor M24) are connected may be connected to the fourth transistor M34. That is, in FIG. 9, the sixth transistor M26 of the second circuit CKT2 and the fifth transistor M35 of the third circuit CKT3 may be replaced with one transistor (i.e., M26 of FIG. 11).

In some example embodiments, the third circuit CKT3 and the second inverter INV2 may share at least one transistor. For example, the first transistor M51 may be shared by the third circuit CKT3 and the second inverter INV2. As shown in FIG. 11, a node B to which the first transistor M51 and the second transistor M52 are connected may be connected to the second transistor M32. That is, in FIG. 9, the first transistor M31 of the third circuit CKT3 and the first transistor M51 of the second inverter INV2 may be replaced with one transistor (i.e., M51 of FIG. 11).

In some example embodiments, at least one transistor may be omitted from the fourth circuit CKT4 of FIG. 9. For example, the second transistor M42 of FIG. 9 which is a PFET for receiving the first data signal DT may be omitted from the flip-flop 110. Due to shared transistors, the flip-flop 110 may include fewer transistors than the flip-flop 90 of FIG. 9 and thus, may have a smaller area.

Figure 12:
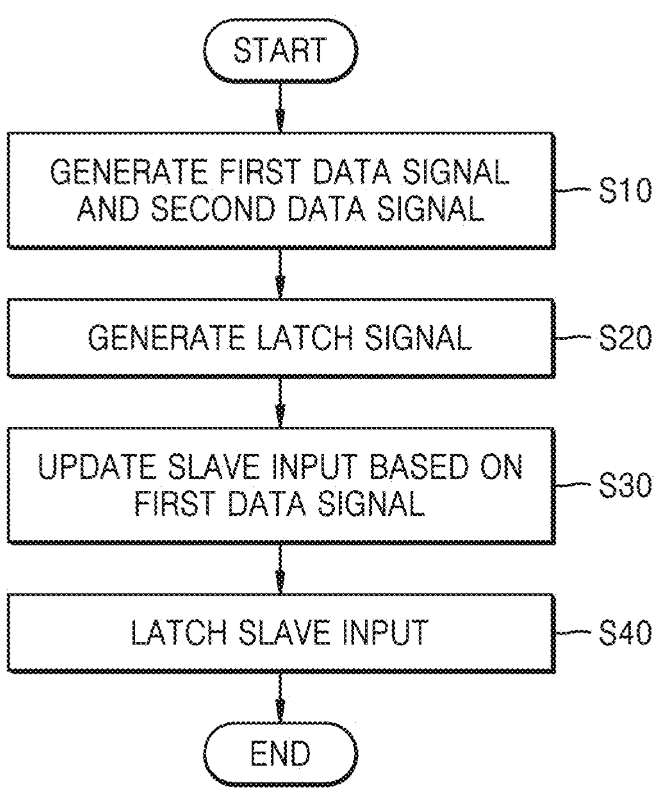
FIG. 12 is a flowchart illustrating an operation of a flip-flop, according to an example embodiment.

FIG. 12 is a flowchart illustrating an operation of a flip-flop, according to an example embodiment. Herein, the operation of FIG. 12 may be referred to as a method of latching the data input D based on the clock signal CK. As shown in FIG. 12, the method of latching the data input D based on the clock signal CK may include a plurality of operations S10 to S40. In some example embodiments, the method of FIG. 12 may be performed by a flip-flop including the master latch 20 of FIG. 2 and the slave latch 70 of FIG. 7. Hereinafter, FIG. 12 will be described with reference to FIGS. 2 and 7.

Referring to FIG. 12, in operation S10, the first data signal DT and the second data signal DN may be generated. For example, the master latch 20 may generate the first data signal DT and the second data signal DN as internal signals of the master latch 20, based on the clock signal CK, the data input D, and the inverted data input DB. The first data signal DT may be complementary to the inverted data input DB, and the second data signal DN may be complementary to the data input D. An example of operation S10 will be described below with reference to FIG. 13.

In operation S20, the latch signal LAT may be generated. For example, the master latch 20 may generate the latch signal LAT based on the clock signal, the slave input QN, and the second data signal DN. The latch signal LAT and the clock signal CK may be used to determine a timing at which the master latch 20 and the slave latch 70 update the slave input QN.

In operation S30, the slave input QN may be updated based on the first data signal DT. For example, the master latch 20 may update the slave input QN based on the clock signal CK and the latch signal LAT. The slave input QN may be an output of the master latch 20 and an input of the slave latch 70, and the slave latch 70 may generate the data output Q by inverting the slave input QN.

In operation S40, the slave input QN may be latched. For example, the slave latch 70 may latch the slave input QN based on the clock signal CK and the latch signal LAT. An example of operation S40 will be described below with reference to FIG. 14.

Figure 13:
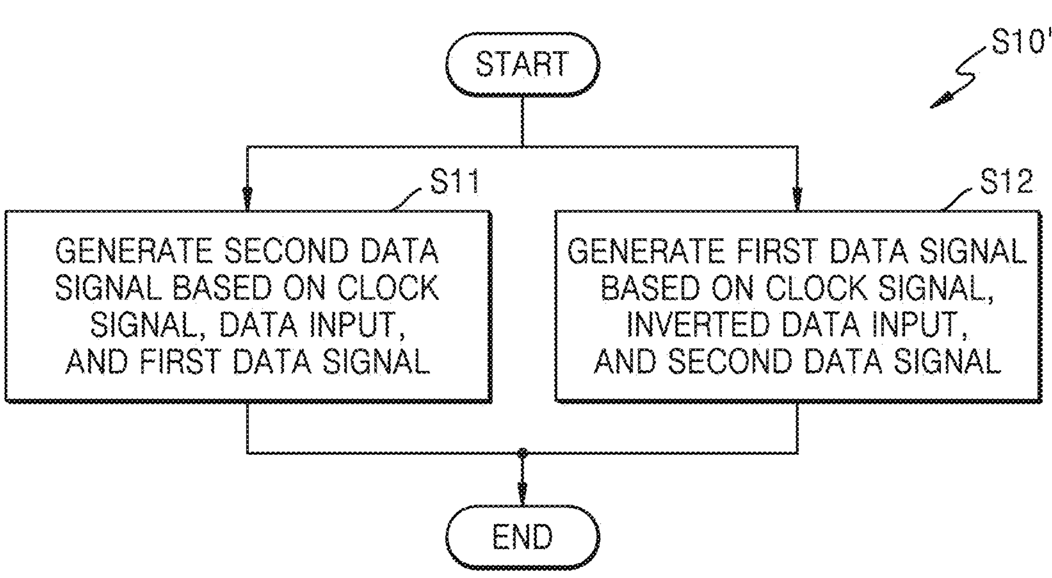
FIG. 13 is a flowchart illustrating an operation of a flip-flop, according to an example embodiment.

FIG. 13 is a flowchart illustrating an operation of a flip-flop, according to an example embodiment. For example, the flowchart of FIG. 13 illustrates an example of operation S10 of FIG. 12. As described with reference to FIG. 12, in operation S10', the first data signal DT and the second data signal DN may be generated. As shown in FIG. 13, operation S10' may include operation S11 and operation S12. In some example embodiments, operation S11 and operation S12 may be performed in parallel. In some example embodiments, operation S10' may be performed by the master latch 20 of FIG. 2. Hereinafter, FIG. 13 will be described with reference to FIG. 2.

Referring to FIG. 13, in operation S11, the second data signal DN may be generated based on the clock signal CK, the data input D, and the first data signal DT. For example, the first circuit 21 may receive the clock signal CK, the data input D, and the first data signal DT and may generate the second data signal DN complementary to the data input D. As described above with reference to the drawings, the second data signal DN may be generated independently of the latch signal LAT and may be completely driven.

In operation S12, the first data signal DT may be generated based on the clock signal CK, the inverted data input DB, and the second data signal DN. For example, the second circuit 22 may receive the clock signal CK, the inverted data input DB, and the second data signal DN and may generate the first data signal DT complementary to the inverted data input DB. As described above with reference to the drawings, the first data signal DT may be generated independently of the latch signal LAT and may be completely driven.

Figure 14:
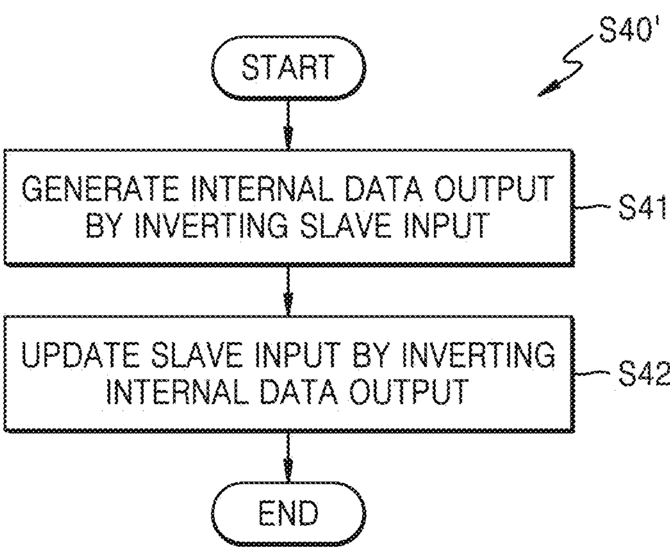
FIG. 14 is a flowchart illustrating an operation of a flip-flop, according to an example embodiment.

FIG. 14 is a flowchart illustrating an operation of a flip-flop, according to an example embodiment. For example, the flowchart of FIG. 14 illustrates an example of operation S40 of FIG. 12. As described with reference to FIG. 12, in operation S40', the slave input QN may be latched. As shown in FIG. 14, operation S40' may include operation S41 and operation S42. In some example embodiments, operation S40' may be performed by the slave latch 70 of FIG. 7. Hereinafter, FIG. 14 will be described with reference to FIG. 7.

Referring to FIG. 14, in operation S41, the internal data output QI may be generated by inverting the slave input QN. For example, the first inverter INV1 may receive the slave input QN and may generate the internal data output QI. The internal data output QI may have the same polarity as the data output Q generated by inverting the slave input QN.

In operation S42, the slave input QN may be updated by inverting the internal data output QI. For example, the second inverter INV2 may invert the internal data output QI based on the clock signal CK and the latch signal LAT. When the clock signal CK is 0 and the latch signal LAT is 1, the second inverter INV2 may invert the internal data output QI, and the slave input QN may be updated.

Figure 15:
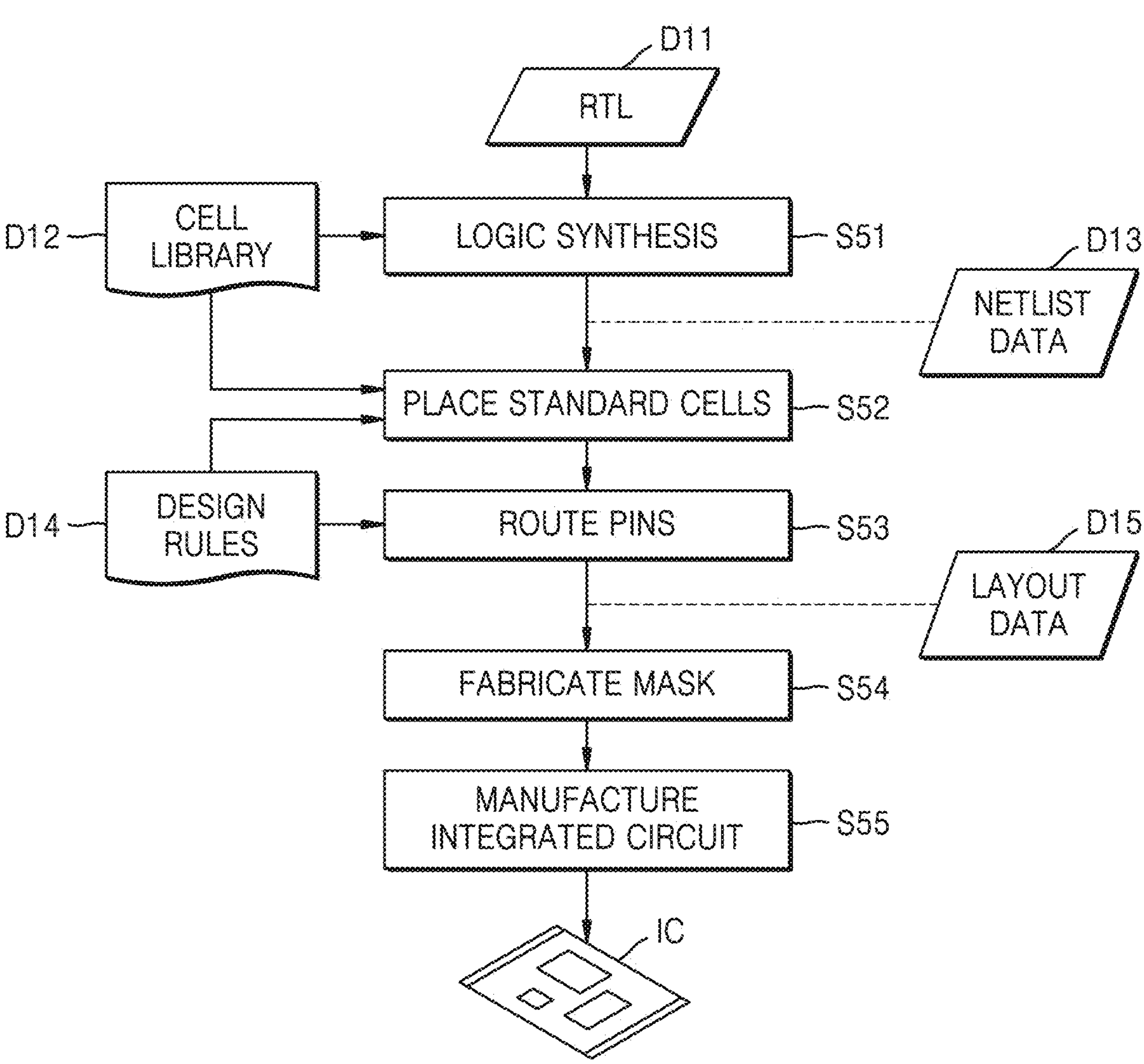
FIG. 15 is a flowchart illustrating a method of manufacturing an integrated circuit, according to an example embodiment.

FIG. 15 is a flowchart illustrating a method of manufacturing an integrated circuit IC, according to an example embodiment. In detail, the flowchart of FIG. 15 illustrates an example of a method of manufacturing an integrated circuit IC including standard cells. A standard cell is a unit of a layout included in an integrated circuit and may be designed to perform a pre-defined function. As shown in FIG. 15, the method of manufacturing the integrated circuit IC may include a plurality of operations S51 to S55.

A cell library (or a standard cell library) D12 may include information about standard cells, for example, information about functions, characteristics, and layouts of standard cells. In some example embodiments, a flip-flop described above with reference to the drawings, that is, a flip-flop including a master latch and a slave latch, may be included as a standard cell in the integrated circuit IC. For example, the cell library D12 may include information about cells corresponding to the flip-flop described above with reference to the drawings. Accordingly, the integrated circuit IC may have reduced power consumption and improved operating speed.

Design rules D14 may include requirements for a layout of the integrated circuit IC. For example, the design rules D14 may include requirements for a space between patterns in the same layer, a minimum width of a pattern, a routing direction of a wiring layer, and the like. In some example embodiments, the design rules D14 may define a minimum separation distance in the same track of a wiring layer.

In operation S51, a logic synthesis operation of generating netlist data D13 from RTL data D11 may be performed. For example, a semiconductor design tool (e.g., a logic synthesis tool) may perform logic synthesis with reference to the cell library D12 from the RTL data D11 written in hardware description language (HDL) such as VHSIC hardware description language (VHDL) or Verilog, and may generate the netlist data D13 including a bitstream or a netlist. The netlist data D13 may correspond to the input of placement and routing described below.

In operation S52, standard cells may be placed. For example, a semiconductor design tool (e.g., a P&R tool) may place the standard cells, which are used in the netlist data D13, with reference to the cell library D12. In some example embodiments, the semiconductor design tool may place the standard cells in rows extending parallel to each other, and the placed standard cells may receive power from a power rail extending along boundaries of the rows.

In operation S53, pins of the standard cells may be routed. For example, a semiconductor design tool may generate interconnections that electrically connect output pins and input pins of the placed standard cells, and may generate layout data D15 that defines the placed standard cells and the generated interconnections. An interconnection may include a via of a via layer and/or patterns of wiring layers. In some example embodiments, the wiring layers may include not only a front side wiring layer located on a gate electrode, but also a backside wiring layer located under the gate electrode. The layout data D15 may have a format such as GDSII and may include geometric information of the cells and the interconnections. A semiconductor design tool may refer to the design rules D14 while routing the pins of the cells. The layout data D15 may correspond to the output of placement and routing. Operation S53 may be solely or operation S52 and operation S53 may be collectively referred to as a method of designing an integrated circuit.

In operation S54, an operation of fabricating a mask may be performed. For example, optical proximity correction (OPC) for correcting distortion such as refraction caused by the characteristics of light in photolithography may be applied to the layout data D15. Patterns on a mask may be defined to form patterns arranged on a plurality of layers based on the data to which OPC is applied, and at least one mask (or photomask) for forming patterns of each of the plurality of layers may be fabricated. In some example embodiments, the layout of the integrated circuit IC may be limitedly modified in operation S54. The limited modification of the integrated circuit IC in operation S54 may be post-processing for optimizing a structure of the integrated circuit IC and may be referred to as design polishing.

In operation S55, an operation of manufacturing the integrated circuit IC may be performed. For example, the integrated circuit IC may be manufactured by patterning a plurality of layers by using at least one mask fabricated in operation S54. A front-end-of-line (FEOL) may include, for example, planarizing and cleaning a wafer, forming a trench, forming a well, forming a gate electrode, and forming a source and a drain. Individual devices, for example, a transistor, a capacitor, and a resistor, may be formed by the FEOL. Also, a back-end-of-line (BEOL) may include silicidation of a gate and source and drain regions, adding a dielectric, planarization, forming a hole, adding a metal layer, forming a via, and forming a passivation layer. The individual devices, for example, a transistor, a capacitor, and a resistor, may be interconnected to each other by the BEOL. In some example embodiments, a middle-of-line (MOL) may be performed between the FEOL and the BEOL, and contacts may be formed in the individual devices. Next, the integrated circuit IC may be packaged in a semiconductor package and may be used as a component of various applications.

Figure 16:
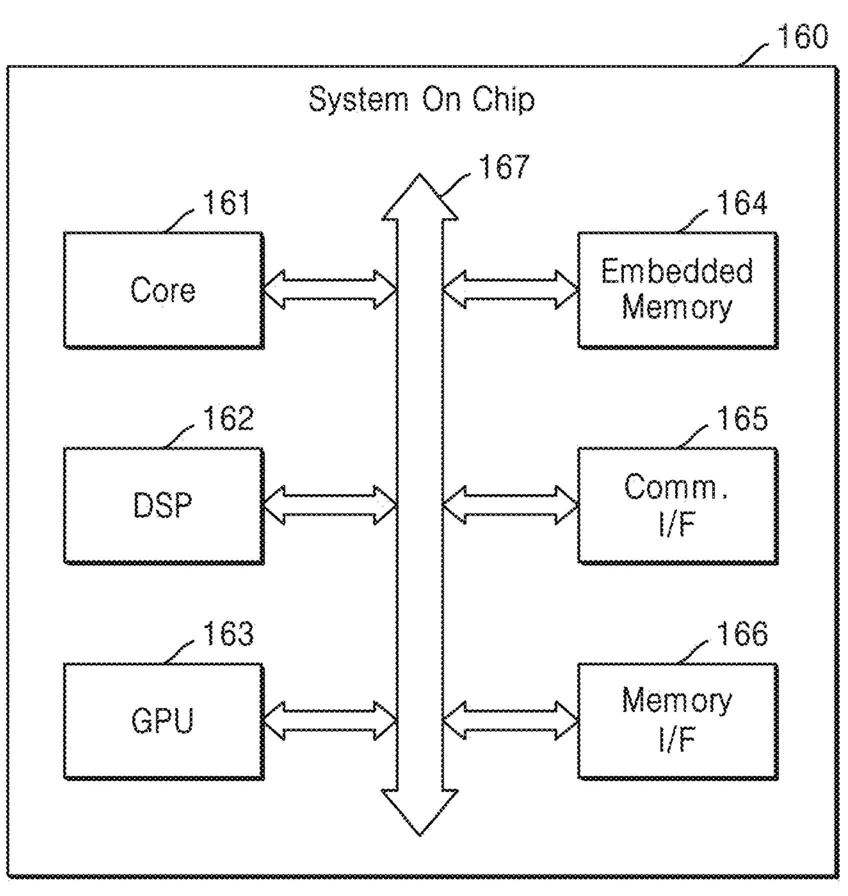
FIG. 16 is a block diagram illustrating a system-on-chip, according to an example embodiment.

FIG. 16 is a block diagram illustrating a system-on-chip (SoC) 160, according to an example embodiment. The SoC 160 may refer to an integrated circuit in which components of a computing system or another electronic system are integrated. For example, an application processor (AP) as an example of the SoC 160 may include a processor and components for other functions. As shown in FIG. 16, the SoC 160 may include a core 161, a digital signal processor (DSP) 162, a graphics processing unit (GPU) 163, an embedded memory 164, a communication interface 165, and a memory interface 166. Elements of the SoC 160 may communicate with each other through a bus 167.

The elements of the SoC 160 may include flip-flops described above with reference to the drawings. Accordingly, the elements may have low power consumption and improved operating speed. As a result, the efficiency and performance of the SoC 160 may be improved.

The core 161 may process instructions and may control operations of the elements included in the SoC 160. For example, the core 161 may drive an operating system by processing a series of instructions and may execute applications on the operating system. The DSP 162 may generate useful data by processing a digital signal, for example, a digital signal provided from the communication interface 165. The GPU 163 may generate data for an image output through a display device from image data provided from the embedded memory 164 or the memory interface 166 or may encode the image data. The embedded memory 164 may store data required for the core 161, the DSP 162, and the GPU 163 to operate. The communication interface 165 may provide an interface for one-to-one communication or a communication network. The memory interface 166 may provide an interface for an external memory of the SoC 160, for example, a dynamic random-access memory (DRAM) or a flash memory.

As described above, example embodiments have been illustrated in the drawings and described. While example embodiments have been described by using specific terms, the terms have merely been used to explain the technical idea of the inventive concept and should not be construed as limiting the scope of the inventive concept defined by the claims. Hence, it will be understood by one of ordinary skill in the art that various modifications and other equivalent example embodiments may be made therefrom.

While aspects of example embodiments have been particularly shown and described, it will be understood that various changes in form and details may be made therein without departing from the spirit and scope of the following claims.

What is claimed is:

1. A flip-flop comprising:

a master latch; and a slave latch, wherein the master latch comprises:

a first circuit configured to, based on a clock signal, a data input signal, and a first data signal, generate a second data signal complementary to the data input signal;

a second circuit configured to, based on the clock signal, an inverted data input signal, and the second data signal, generate the first data signal complementary to the inverted data input signal; and a third circuit configured to generate a latch signal based on the clock signal, an input of the slave latch, and the second data signal, and wherein the slave latch is configured to latch the input of the slave latch based on the clock signal and the latch signal, and comprises:

a first inverter configured to invert the input of the slave latch; and a second inverter configured to update the input of the slave latch based on an output of the first inverter, the latch signal and the clock signal.

2. The flip-flop of claim 1, wherein the first circuit comprises:

first to third p-channel field effect transistors (PFETs) configured to respectively receive the clock signal, the data input signal, and the first data signal; and first to third n-channel field effect transistors (NFETs) configured to respectively receive the data input signal, the clock signal, and the first data signal.

3. The flip-flop of claim 2, wherein the first PFET and the second PFET are connected in series to each other between a first power node to which a positive supply voltage is applied and a first node where the second data signal is generated, wherein the third PFET is connected between the first power node and the first node, wherein the first NFET and the second NFET are connected in parallel to each other between the first node and a second node, and wherein the third NFET is connected between the second node and a second power node to which a negative supply voltage is applied.

4. The flip-flop of claim 1, wherein the second circuit comprises:

first to third PFETs configured to respectively receive the clock signal, the inverted data input signal, and the second data signal; and first to third NFETs configured to respectively receive the inverted data input signal, the clock signal, and the second data signal.

5. The flip-flop of claim 4, wherein the first PFET and the second PFET are connected in series to each other between a first power node to which a positive supply voltage is applied and a first node where the first data signal is generated, wherein the third PFET is connected between the first power node and the first node, wherein the first NFET and the second NFET are connected in parallel to each other between the first node and a second node, and wherein the third NFET is connected between the second node and a second power node to which a negative supply voltage is applied.

6. The flip-flop of claim 5, wherein the first PFET is shared with the first circuit.

7. The flip-flop of claim 1, wherein the third circuit comprises:

first to third PFETs configured to respectively receive the clock signal, the input of the slave latch, and the second data signal; and a first NFET and a second NFET configured to respectively receive the clock signal and the second data signal.

8. The flip-flop of claim 7, wherein the first PFET and the second PFET are connected in series to each other between a first power node to which a positive supply voltage is applied and a first node where the latch signal is generated, wherein the third PFET is connected between the first power node and the first node, and wherein the first NFET and the second NFET are connected in series to each other between the first node and a second power node to which a negative supply voltage is applied.

9. The flip-flop of claim 8, wherein the second NFET is shared with the second circuit.

10. The flip-flop of claim 1, wherein the master latch further comprises a fourth circuit configured to update the input of the slave latch based on the first data signal, the clock signal and the latch signal.

11. The flip-flop of claim 10, wherein the fourth circuit comprises:

a first PFET and a second PFET configured to respectively receive the latch signal and the first data signal, wherein the first PFET and the second PFET are connected in series to each other between a first power node to which a positive supply voltage is applied and a first node where the input of the slave latch is generated; and a first NFET and a second NFET configured to respectively receive the first data signal and the clock signal, wherein the first NFET and the second NFET are connected in series to each other between the first node and a second power node to which a negative supply voltage is applied.

12. The flip-flop of claim 10, wherein the fourth circuit comprises:

a first PFET configured to receive the latch signal and connected between a first power node to which a positive supply voltage is applied and a first node where the input of the slave latch is generated; and a first NFET and a second NFET configured to respectively receive the first data signal and the clock signal, wherein the first NFET and the second NFET are connected in series to each other between the first node and a second power node to which a negative supply voltage is applied.

13. The flip-flop of claim 1, wherein the second inverter comprises:

a first PFET and a second PFET configured to respectively receive the clock signal and the output of the first inverter, wherein the first PFET and the second PFET are connected in series to each other between a first power node to which a positive supply voltage is applied and a first node where the input of the slave latch is generated; and a first NFET and a second NFET configured to respectively receive the output of the first inverter and the latch signal, wherein the first NFET and the second NFET are connected in series to each other between the first node and a second power node to which a negative supply voltage is applied.

14. The flip-flop of claim 13, wherein the first PFET is shared with the third circuit.

15. A flip-flop comprising:

a slave latch; and a master latch configured to generate a first data signal and a second data signal based on a clock signal, a data input signal, and an inverted data input signal, and generate a latch signal based on the clock signal, an input of the slave latch, and the second data signal, wherein the first data signal is complementary to the inverted data input signal and the second data signal is complementary to the data input signal, wherein the slave latch is configured to latch the input of the slave latch based on the clock signal and the latch signal, and comprises:

a first inverter configured to invert the input of the slave latch; and a second inverter configured to update the input of the slave latch based on an output of the first inverter, the latch signal and the clock signal.

16. The flip-flop of claim 15, wherein the master latch is further configured to generate the first data signal based on the clock signal, the inverted data input signal, and the second data signal.

17. The flip-flop of claim 15, wherein the master latch is further configured to generate the second data signal based on the clock signal, the data input signal, and the first data signal.

18. The flip-flop of claim 15, wherein the master latch is further configured to update the input of the slave latch based on the first data signal, the clock signal and the latch signal.

19. A method of latching a data input signal based on a clock signal, the method comprising:

based on the clock signal, the data input signal, and an inverted data input signal, generating a first data signal complementary to the inverted data input signal and a second data signal complementary to the data input signal;

generating a latch signal based on the clock signal, an input of a slave latch, and the second data signal; and latching the input of the slave latch based on the clock signal and the latch signal, wherein the latching comprises inverting the input of the slave latch using a first inverter and updating the input of the slave latch, using a second inverter, based on an output of the first inverter, the latch signal and the clock signal.

* * * * *